(12) United States Patent
Chen et al.

(10) Patent No.: US 9,072,190 B2
(45) Date of Patent: Jun. 30, 2015

(54) CABLE MANAGEMENT ARM (71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Chien-Li Huang, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 403 days.

(21) Appl. No.: 13/707,837

(22) Filed: Dec. 7, 2012

(65) Prior Publication Data

US 2014/0158646 A1    Jun. 12, 2014

(51) Int. Cl.
  *A47F 7/00*     (2006.01)
  *H05K 7/14*    (2006.01)

(52) U.S. Cl.
  CPC ............ *H05K 7/1421* (2013.01); *H05K 7/1491* (2013.01)

(58) Field of Classification Search
  CPC ..... H05K 7/02; H05K 7/1421; H05K 7/1491; F16L 3/00; F16L 3/01; F16L 3/015; F16L 3/02; F16L 3/06
  USPC ............... 211/26; 174/68.3; 248/70; 361/747
  See application file for complete search history.

(56) References Cited

U.S. PATENT DOCUMENTS

| | | | |
|---|---|---|---|
| 7,472,795 B2 | 1/2009 | Dubon et al. | |
| 7,554,819 B2 | 6/2009 | Chen et al. | |
| 7,654,398 B2 | 2/2010 | Bridges et al. | |
| 7,712,615 B2 | 5/2010 | Chen et al. | |
| 7,746,667 B1 | 6/2010 | Baiza et al. | |
| 8,231,014 B2 | 7/2012 | Chen et al. | |
| 8,251,321 B2* | 8/2012 | Chen et al. | 248/70 |
| 2006/0081736 A1* | 4/2006 | Chen et al. | 248/68.1 |
| 2006/0113433 A1* | 6/2006 | Chen et al. | 248/70 |
| 2008/0164789 A1* | 7/2008 | Williams | 312/223.1 |
| 2009/0014601 A1* | 1/2009 | Chen et al. | 248/70 |
| 2009/0065658 A1* | 3/2009 | Chen et al. | 248/70 |
| 2010/0193646 A1* | 8/2010 | Chen et al. | 248/70 |
| 2011/0180297 A1* | 7/2011 | Yu et al. | 174/69 |

* cited by examiner

*Primary Examiner* — Korie H Chan
(74) *Attorney, Agent, or Firm* — Rosenberg, Klein & Lee (57) ABSTRACT

A cable management arm includes a first arm, a second arm, a frame, an extension board, a support seat, a first support member, a second support member and a slide. The frame is pivotably connected between the first and second arms. The extension board is connected to the bottom of the frame. The first support member is pivotably connected to the support seat. The second support member is slidably connected to the first support member. The slide is pivotably connected to the extension board and the frame and slidably connected to the second support member. When the second arm is pulled relative to the first arm, the frame is moved from the support seat by sliding the slide along the second support member. The slide moves the second support member to extend relative to the first support member, so that the first support member swings relative to the support.

20 Claims, 13 Drawing Sheets

CABLE MANAGEMENT ARM

FIELD OF THE INVENTION

The present invention relates to a cable management arm, and more particularly, to a cable supporting device for support the cables.

BACKGROUND OF THE INVENTION

The conventional cable management arms are disclosed in U.S. Pat. No. 7,472,795 B2 to Dubon et al, U.S. Pat. No. 7,654,398 B2 to Bridges et al, U.S. Pat. No. 7,746,667 B1 to Baiza et al, U.S. Pat. No. 7,554,819 B2 to Chen et al, U.S. Pat. No. 7,712,615 B2 to Chen et al, U.S. Pat. No. 8,231,014 B2 to Chen et al, and U.S. Pat. No. 8,251,321 B2 to Chen et al.

However, these cable management arms are not convenient when being installed and operated. The present invention intends to provide an improved cable management arm to improve the shortcomings of the conventional ones.

SUMMARY OF THE INVENTION

The present invention relates to a cable management arm and comprises a first arm, a second arm, a frame, an extension board, a support seat, a first connection element, a second connection element, a third connection element, a first support member, a second support member, a first resilient member and a slide. The frame is pivotably connected between the first and second arms. The extension board is fixed to the bottom of the frame. The support seat has a support board. The first connection element is connected to the first arm. The second connection element is connected to the second arm. The third connection element is connected to the support seat. The first support member is pivotably connected to the support seat and contacts the support board of the support seat. The second support member is slidably connected to the first support member and retractable relative to the first support member. The first resilient member is connected between the first and second support members, so that the second support member is pulled relative to the first support member by the first resilient member. The slide is pivotably connected to the bottom of the frame and contacts the extension board. The slide is slidably connected to the second support member. The first arm is located at a fixed first position by the first connection element. The second arm is located at a movable second position by the second connection element. The support seat is located at a fixed third position by the third connection element. When the second connection element of the second arm is moved away from the first connection element of the first arm, the frame is moved away from the support seat by the sliding movement of the slide along the second support member. The slide moves the second support member to extend relative to the first support member, and the first support member swings relative to the support seat.

Preferably, the second support member has a first block which is located corresponding to the slide. The slide contacts the first block and drives the second support member relative to the first support member.

Preferably, the second support member has a second block which is located corresponding to the slide. The slide slides between the first block and the second block.

Preferably, the first support member has a first hook and the second support member has a second hook. The first resilient member is connected between the first and second hooks.

Preferably, the support seat is pivotably connected to the third connection element by a first pivoting member. The first support member is pivotably connected to the support seat by a second pivoting member.

Preferably, a second resilient member is connected between the first support member and the support seat. The first support member is able to return within a pre-set angular range relative to the support seat by the second resilient member.

Preferably, the second resilient member has a scrolling portion which is mounted to the first pivoting member and the scrolling portion has a first resilient leg extending therefrom which contacts the first support member.

Preferably, the support board of the support seat is generally horizontal and has a round periphery whose center is located at the axis of the second pivoting member. A pin is connected to the first support member which is movable along the round periphery of the support seat by the pin.

Preferably, the support seat, the third connection element and the first support member are pivotably connected to each other by the first pivoting member.

Preferably, a second resilient member is connected between the support seat and the first support member, so that the first support member is able to return within a pre-set angular range relative to the support seat by the second resilient member.

Preferably, the support seat has a fixing portion fixed to the second resilient member. The second resilient member has two second resilient legs which contact the two sides of the first support member respectively.

Preferably, the support seat has a curved slot whose center is located at the axis of the first pivoting member. The first support member is movably located in the curved slot by a pin.

Preferably, the extension board has a rib extending downward therefrom and the rib contacts the slide.

Preferably, the thickness of the rib is gradually increased from a middle position/center near an edge of the bottom of the extension board to two sides of the extension board.

Preferably, a stop member is connected to the support seat and has at least one first stop, the third connection element has a first protrusion located corresponding to the at least one first stop. The support seat contacts the first protrusion of the third connection element by the at least one first stop of the stop member.

Preferably, the stop member has an extension arm and a second stop which is connected to the extension arm. The second stop is located to contact one side of the first support member.

Preferably, the stop member has two first stops, two extension arms, and two second stops which are connected to the two extension arms. One of the two first stops contacts the first protrusion of the third connection element. One of the second stops contacts the first support member.

Preferably, each of the two extension arms of the stop member has a triggering portion. The third connection element has a second protrusion which is located corresponding to the triggering portion of one of the two extension arms. The second protrusion contacts the triggering portion to move the second stops away from the first support member.

Preferably, the cable management arm further comprises a first slide assembly and a second slide assembly. The first slide assembly has a first fixed rail and a first movable rail which is longitudinally movable relative to the first fixed rail. The second slide assembly has a second fixed rail and a second movable rail which is longitudinally movable relative to the second fixed rail. The first connection element is connected to the first fixed rail and secured at a first position. The second connection element is connected to the first movable rail and located at a second position which is variable when the first movable rail is moved relative to the first fixed rail. The third connection element is connected to the second fixed rail of the second slide assembly and secured at a third position.

Alternatively, the present invention provides a cable management arm and comprises a first slide assembly having a first fixed rail and a first movable rail which is longitudinally movable relative to the first fixed rail. A second slide assembly has a second fixed rail and a second movable rail which is longitudinally movable relative to the second fixed rail. A first arm is connected to the first fixed rail of the first slide assembly. A second arm is connected to the first movable rail of the first slide assembly. A frame is pivotably connected between the first and second arms. A support seat is connected to the second fixed rail of the second slide assembly. A first support member is pivotably connected to the support seat and contacts the support seat. A second support member is slidably connected to the first support member. A first resilient member is connected between the first and second support members. A slide is pivotably connected to the frame and slidably connected to the second support member. When the first and second slide assemblies are pulled, the second arm moves away from the first arm and hence the angle between the first and second arms is increased, the slide slides along the second support member and away from the support seat. The slide drives the second support member to extend relative to the first support member, so that the first support member swings relative to the support seat. When the first and second slide assemblies are retracted, the second arm moves toward the first arm. The second support member moves in response to the first resilient member and relative to the first support member.

The present invention will become more obvious from the following description when taken in connection with the accompanying drawings which show, for purposes of illustration only, a preferred embodiment in accordance with the present invention.

DETAILED DESCRIPTION OF THE PREFERRED EMBODIMENT

Figure 1:
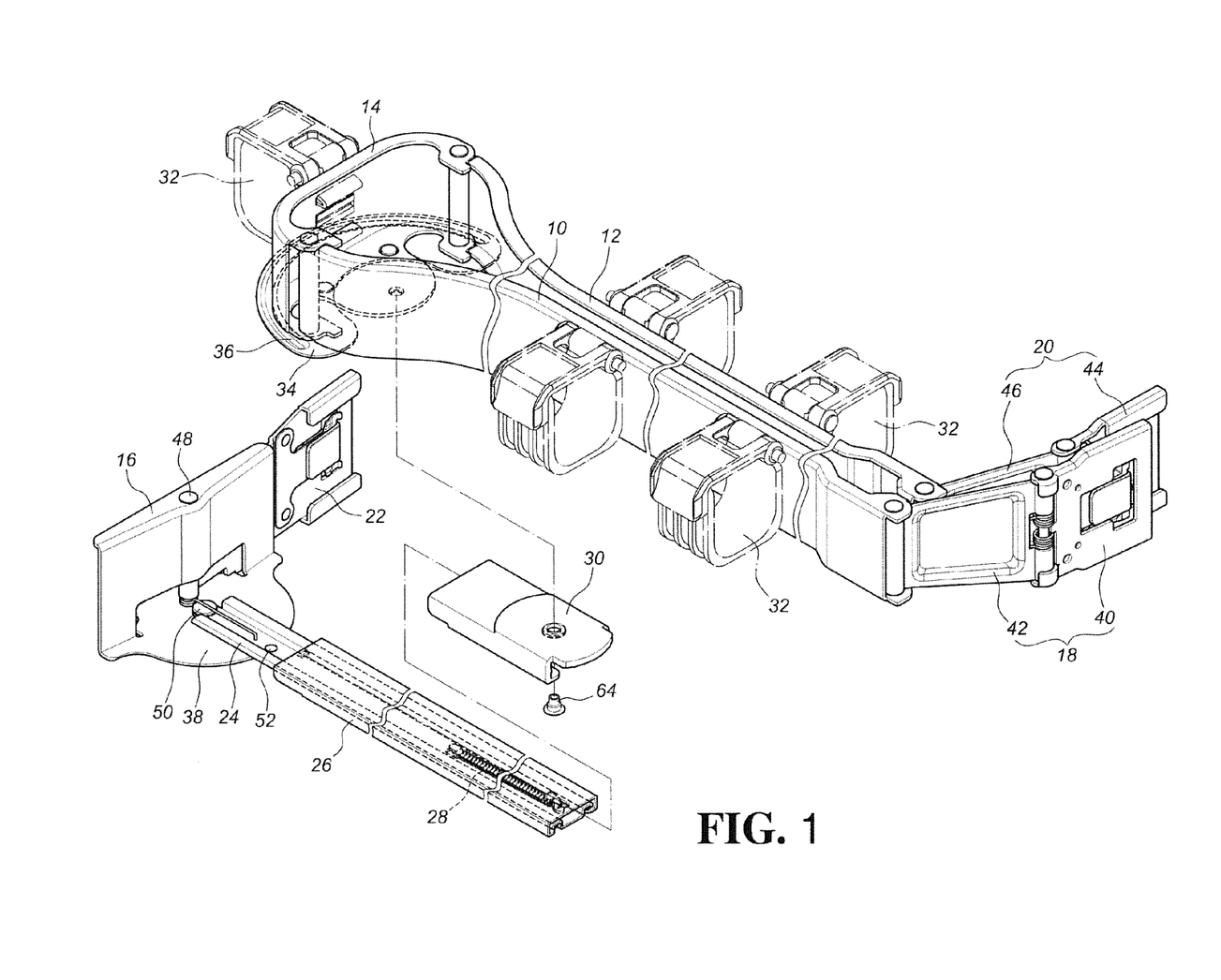
FIG. 1 is an exploded view to show the cable management arm of the present invention.
Figure 2:
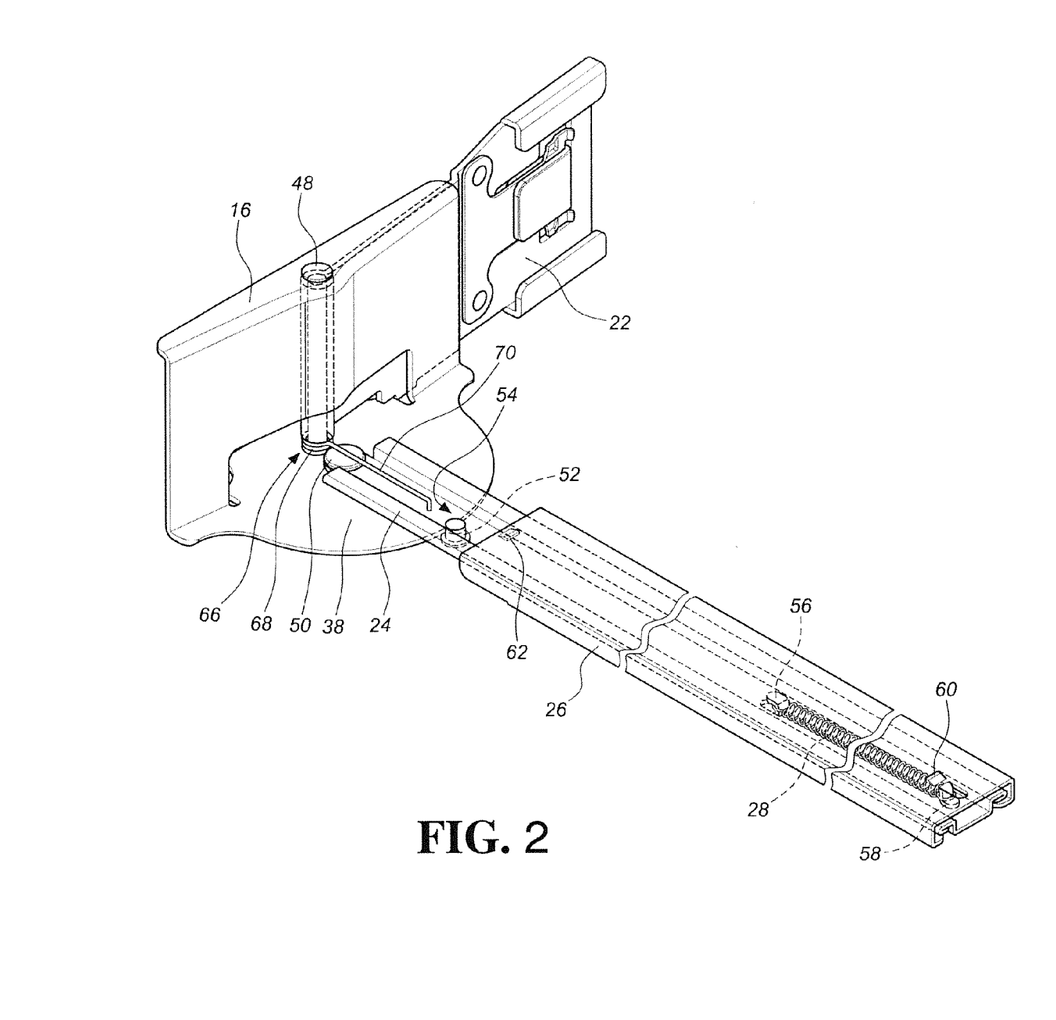
FIG. 2 is a perspective view to show a part of the cable management arm of the present invention.
Figure 3:
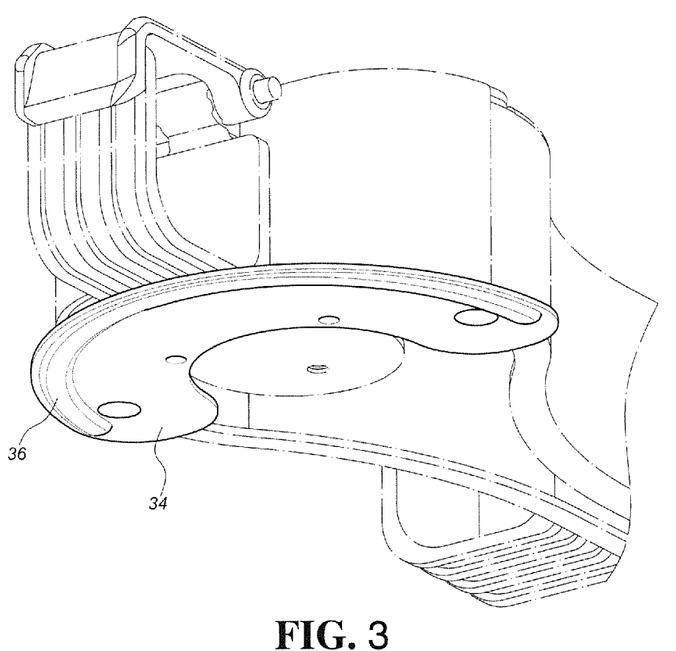
FIG. 3 shows the changes of the thickness of the rib of the extension board of the cable management arm of the present invention.

Referring to FIGS. 1 and 2, the cable management arm of the present invention comprises a first arm 10, a second arm 12, a frame 14, a support seat 16, a first connection element 18, a second connection element 20, a third connection element 22, a first support member 24, a second support member 26, a first resilient member 28, a slide 30 and multiple cable supports 32. The cable supports 32 are located on the first arm 10, the second arm 12 and the frame 14 so as to support cables (not shown).

The frame 14 is pivotably connected between the first and second arms 10, 12, and has an extension board 34. In a preferable embodiment, the extension board 34 is an individual board and fixed to the lower portion/bottom of the frame 14. Alternatively, the extension board 34 is integrally formed with the frame 14. The extension board 34 has a rib 36 extending downward therefrom and the thickness of the rib 36 is gradually increased from a center near an edge of the bottom of the extension board 34 to two sides of the extension board 34.

The support seat 16 has a support board 38. Preferably, the support board 38 is generally horizontal and has a round periphery.

The first connection element 18 is connected to the first arm 10 and has a first engaging member 40 and a first connection plate 42 which is pivotably connected to the first engaging member 40. In a preferable embodiment, the first connection plate 42 is pivotably connected to the first arm 10.

The second connection element 20 is connected to the second arm 12 and has a second engaging member 44 and a second connection plate 46 which is pivotably connected to the second engaging member 44. In a preferable embodiment, the second connection plate 46 is pivotably connected to the second arm 12.

The third connection element 22 is pivotably connected to the support seat 16 by a first pivoting member 48.

The first support member 24 is pivotably connected to and contacts the support board 38 of the support seat 16 by a second pivoting member 50. The first support member 24 has a pin 52 connected thereto and the support board 38 of the support seat 16 has a round periphery whose center is located at the axis of the second pivoting member 50. When the first support member 24 swings relative to the support seat 16, the first support member 24 is movable along the round periphery of the support board 38 of the support seat 16 by the pin 52. As shown in FIG. 2, the first support member 24 has a path 54 and a first hook 56, wherein the path 54 is formed along the length of the first support member 24 and the first hook 56 extends from the wall of the path 54.

The second support member 26 is slidably connected to the first support member 24 and retractable relative to the first support member 24. As shown in FIG. 2, the second support member 26 has a second hook 58 which extends toward the path 54 of the first support member 24. A first block 60 and a second block 62 are connected on two ends of the second support member 26.

The first resilient member 28 is connected between the first hook 56 of the first support member 24 and the second hook 58 of the second support members 26, so that the second support member 26 is pulled relative to the first support member 24 by the first resilient member 28. In other words, the second support member 26 is movable relative to the first support member 24 in response to the force of the first resilient member 28. For example, the second support member 26 is pulled back from an extended position to a retracted position relative to the first support member 24 by the first resilient member 28.

The slide 30 is pivotably connected to the lower portion/bottom of the frame 14 by a pivot 64 and contacts the extension board 34. The slide 30 is slidably connected between the first and second blocks 60, 62 of the second support member 26. It is noted that the extension board 34 can be treated as a part of the frame 14. In other words, the slide 30 can be treated as being pivotably connected to the extension board 34. Preferably, the pivot 64 extends through the slide 30 and the frame 14, and the slide 30 contacts the rib 36 of the extension board 34. Therefore, the connection of the slide 30 and the extension board 34 has a pressing force therebetween in vertical direction. Especially, when the range that the slide 30 swings relative to the frame 14 increases, the thickness of the rib 36 is gradually increased such that the pressing force is increased. The rib 36 contacts against the slide 30, so that the slide 30 is secured to the frame 14. When the slide 30 moves to the distal end of the second support member 26, the slide 30 contacts the first block 60 and drives the second support member 26 to slidingly extend relative to the first support member 24.

In one preferable embodiment, as shown in FIG. 2, a second resilient member 66 is connected between the first support member 24 and the support seat 16, so that the first support member 24 returns within a pre-set angular range relative to the support seat 16 by the second resilient member 66. The second resilient member 66 has a scrolling portion 68 which is mounted to the first pivoting member 48, and the scrolling portion 68 has a first resilient leg 70 extending therefrom which contacts the first support member 24.

Figure 4:
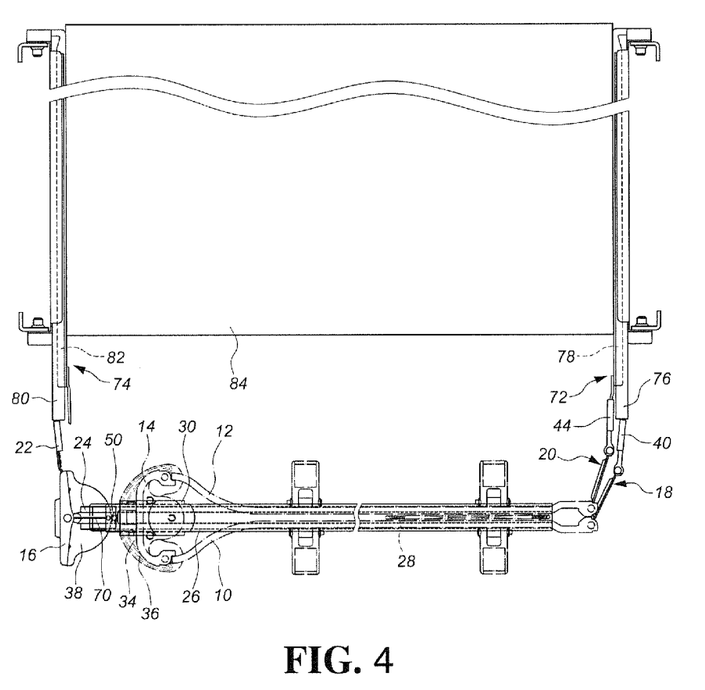
FIG. 4 shows that the cable management arm of the present invention is located at a retracted position.

FIG. 4 shows that the cable management arm is installed to the first and second slide assemblies 72, 74. The first slide assembly 72 has a first fixed rail 76 and a first movable rail 78 which is longitudinally movable relative to the first fixed rail 76. The second slide assembly 74 has a second fixed rail 80 and a second movable rail 82 which is longitudinally movable relative to the second fixed rail 80. A servo equipment 84 is connected between the first and second movable rails 78, 82, and the cables (not shown) of the servo equipment 84 are supported by the first arm 10, the second arm 12 and the frame 14. The first arm 10 is connected to the first fixed rail 76 of the first slide assembly 72 by the first engaging member 40 of the first connection element 18, and one end of the first arm 10 is secured at a first position. The second arm 12 is connected to the first movable rail 78 of the first slide assembly 72 by the second engaging member 44 of the second connection element 20. One end of the second arm 12 is located at a second position which is variable when the first movable rail 78 is moved relative to the first fixed rail 76. The third connection element 22 is connected to the second fixed rail 80 of the second slide assembly 74 to secure the support seat 16 at a third position.

As shown in FIG. 4, when the first and second slide assemblies 72, 74 are in the retracted position, the second arm 12 is located close to the first arm 10, so that the weight center of the whole cable management arm is located close to the frame 14. Wherein, in the retracted position, the second support member 26 is retracted relative to the first support member 24, and the first support member 24 contacts the support board 38 of the support seat 16. Further, the frame 14 is located adjacent to the support seat 16 by the sliding movement of the slide 30 along the second support member 26. Therefore, in the retracted position, the first and second arms 10, 12 are mainly supported by the support seat 16.

Figure 5:
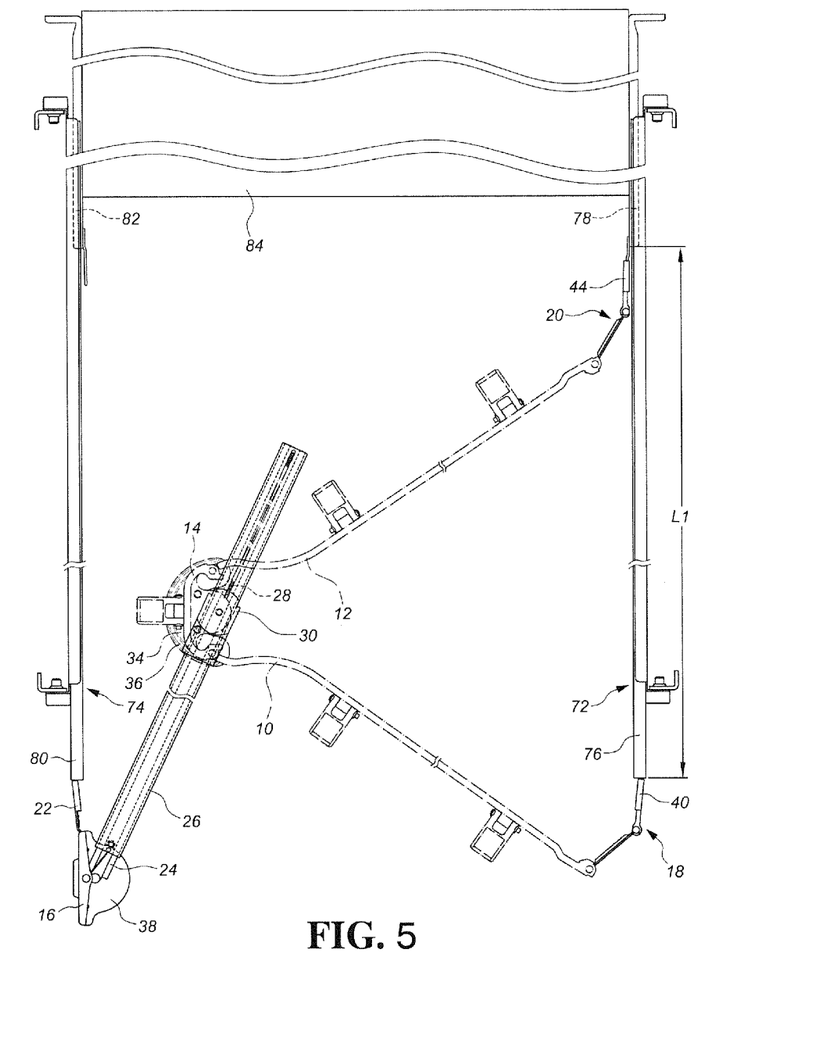
FIG. 5 shows that the second connection element of the second arm is located at a first distance relative to the first connection element of the first arm.

FIG. 5 shows that the first movable rail 78 and the second movable rail 82 are initially extended, the second connection element 20 of the second arm 12 moves a first distance L1 relative to the first connection element 18 of the first arm 10. Wherein, the second support member 26 has not yet extended away from the first support member 24. The frame 14 and the extension board 34 are linearly moved linearly by the sliding movement of the slide 30 along the second support member 26, so that the frame 14 is moved with the second arm 12 longitudinally. The frame 14 drives the first support member 24 to swing relative to the support seat 16 by the slide 30 and the second support member 26. In the meanwhile, the slide 30 swings relative to the frame 14 and the extension board 34. Along with the increased range of the swinging of the slide 30 with the extension board 34, the gradually increasing thickness of the rib 36 contacts the slide 30 to maintain the secure connection between the slide 30 and the extension board 34. Therefore, even if the weight center of the cable management arm is moved from the support seat 16 to the second support member 26, the support seat 16 and the second support member 26 (including the first support member 24) can provide a firm support to the cable management arm.

Figure 6:
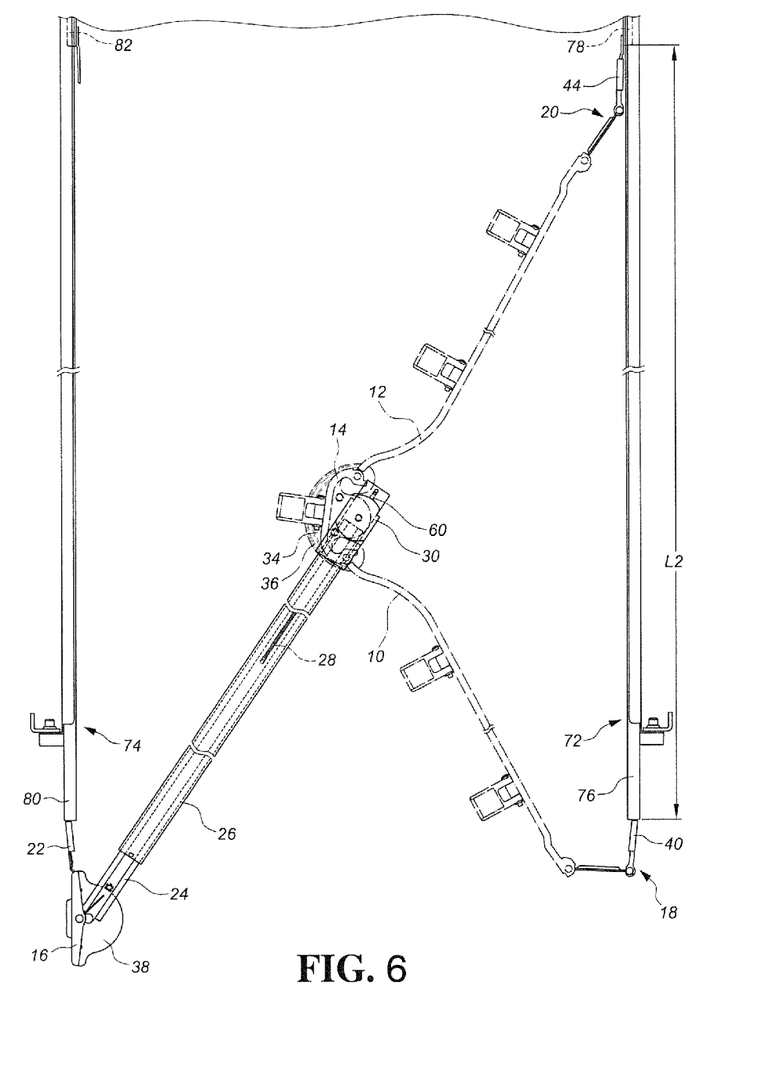
FIG. 6 shows that the second connection element of the second arm is located at a second distance relative to the first connection element of the first arm.

FIG. 6 shows that the second connection element 20 of the second arm 12 moves a second distance L2 relative to the first connection element 18 of the first arm 10. The frame 14 and the extension board 34 are moved to the first block 60 by the sliding movement of the slide 30 along the second support member 26. When the slide 30 contacts the first block 60, the slide 30 drives the second support member 26 to extend relative to the first support member 24, and the first support member 24 swings relative to the support seat 16. In the meanwhile, the first resilient member 28 is extended by the second support member 26 and generates a force to pull the second support member 26. The frame 14 is located away from the support seat 16 and moves toward the first slide assembly 72, and the frame 14 is located close to the mediate position of the transverse distance between the first and second slide assemblies 72, 74. Wherein, the weight that is supported by the cable management arm is gradually shared by the first and second arms 10, 12. The first and second support members 24, 26 are supported by the support seat 16 and share the weight that is supported by the first and second arms 10, 12. In this status, the truss-like structure, formed by the second support member 26, the first support member 24, the first arm 10 and the second arm 12, supports and share the weight that is supported by the cable management arm with good supporting effect.

Figure 7:
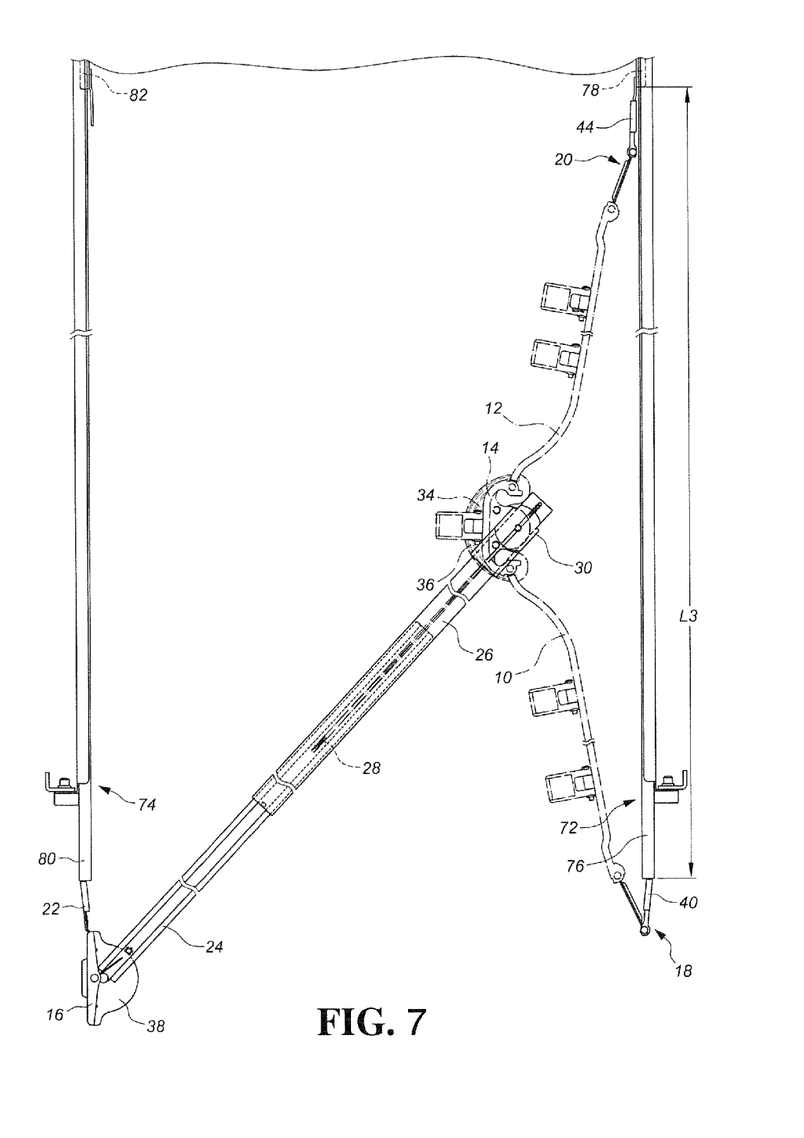
FIG. 7 shows that the second connection element of the second arm is located at a third distance relative to the first connection element of the first arm.

FIG. 7 shows that the second connection element 20 of the second arm 12 moves a third distance L3 relative to the first connection element 18 of the first arm 10. The frame 14 and the extension board 34 are moved by the slide 30 and the second support member 26 is further extended relative to the first support member 24. The first support member 24 swings an even larger angle relative to the support seat 16. The first resilient member 28 continuously provides a pulling force to the second support member 26. The frame 14 moves beyond the mediate position of the transverse distance between the first and second slide assemblies 72, 74, and comes close to the first slide assembly 72. Therefore, the weight of the cable management arm is mostly supported by the first and second arms 10, 12, and the weight applied to the first and second support members 24, 26 is reduced.

Figure 8:
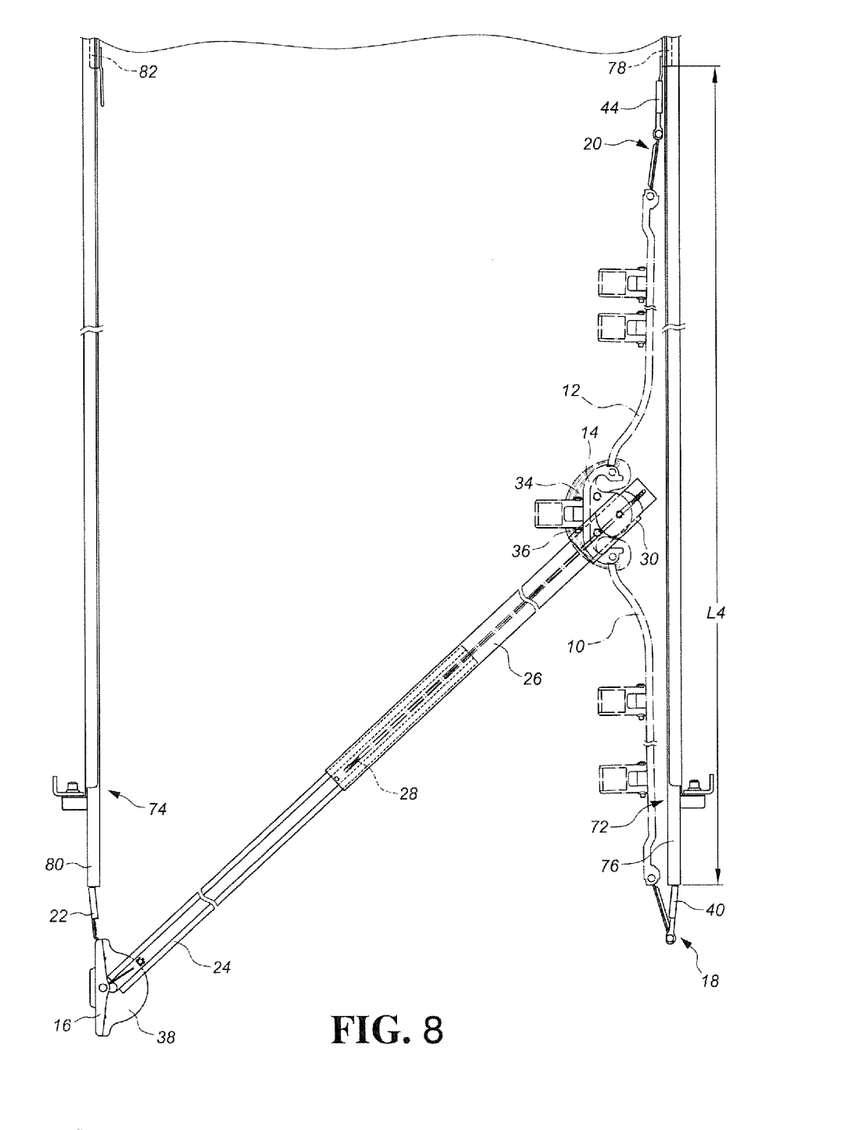
FIG. 8 shows that the second connection element of the second arm is located at a fourth distance relative to the first connection element of the first arm.

FIG. 8 shows that the second connection element 20 of the second arm 12 moves a fourth distance L4, preferably is fully extended, relative to the first connection element 18 of the first arm 10. The frame 14 and the extension board 34 are moved by the slide 30 and the second support member 26 is fully extended relative to the first support member 24. The first support member 24 swings relative to the support seat 16. In the meanwhile, the second support member 26 keeps being pulled by the first resilient member 28. In this status, the frame 14 is located very close to the first rail assembly 72, so that most of the weight of the cable management arm is supported by the first and second arms 10, 12. Wherein, the first and second support members 24, 26 are supported by the frame 14.

It is noted that during the retracting process of the cable management arm, in response to the pulling force of the first resilient member 28, the second support member 26 is automatically pulled backward relative to the first support member 24. In other words, when the slide 30 moves along the second support member 26 and toward the support seat 16, the second support member 26 is automatically retracted relative to the first support member 24. When the first block 60 contacts the slide 30, the movement of the slide 30 and the retraction of the second support member 26 is simultaneously. On the other hand, the first support member 24 automatically pivoted relative to the support seat 16 by the force of the second resilient member 66, so that the cable management arm is retracted back to the desired angular range. Even if the force of the second resilient member 66 is not exist, when the first and second support members 24, 26 are retracted, the sliding movement of the slide 30 along the second support member 26 can drive the first support member 24 to swing back to the pre-set/desired angular range.

Figure 9:
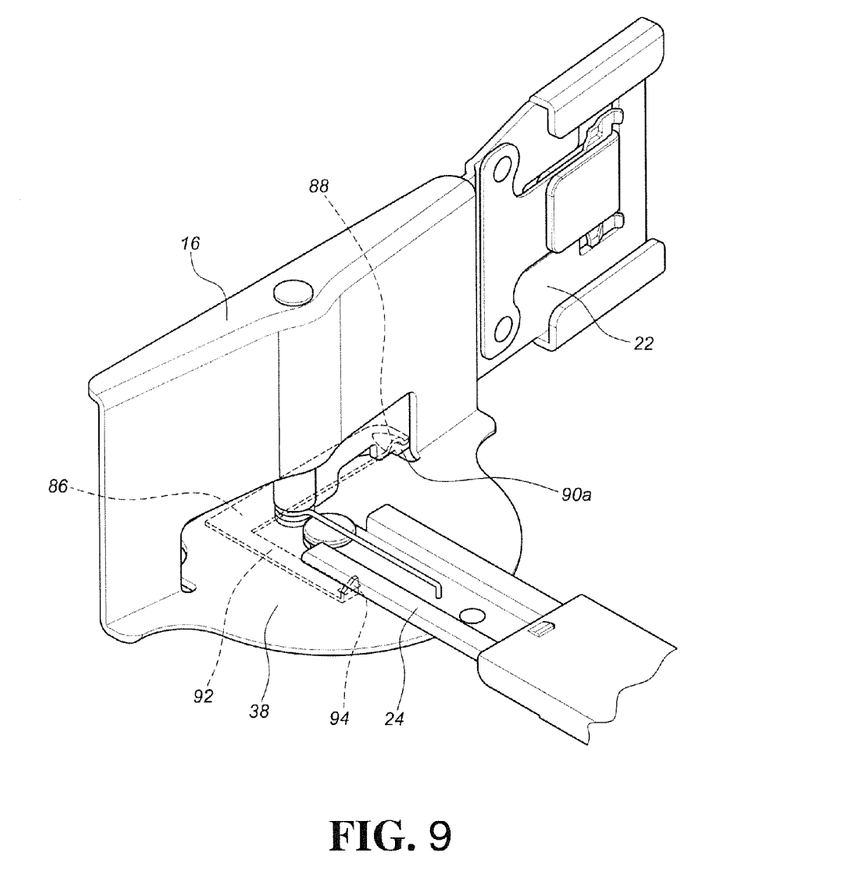
FIG. 9 shows that the first type of the stop member contacts the first support member.

FIG. 9 shows a first type of a stop member 86 of the present invention. The stop member 86 is connected to the support seat 16 and has at least one first stop 88. The third connection element 22 has a first protrusion 90a located corresponding to the at least one first stop 88. The support seat 16 contacts the first protrusion 90a of the third connection element 22 by the at least one first stop 88 of the stop member 86, so that the connection between the support seat 16 and the third connection element 22 is secured and does not swing or shift. Wherein, the stop member 86 further comprises an extension arm 92 and a second stop 94 which is connected to the extension arm 92. The second stop 94 is located to contact one side of the first support member 24, so that the first support member 24 can only swing toward the third connection element 22.

Figure 10:
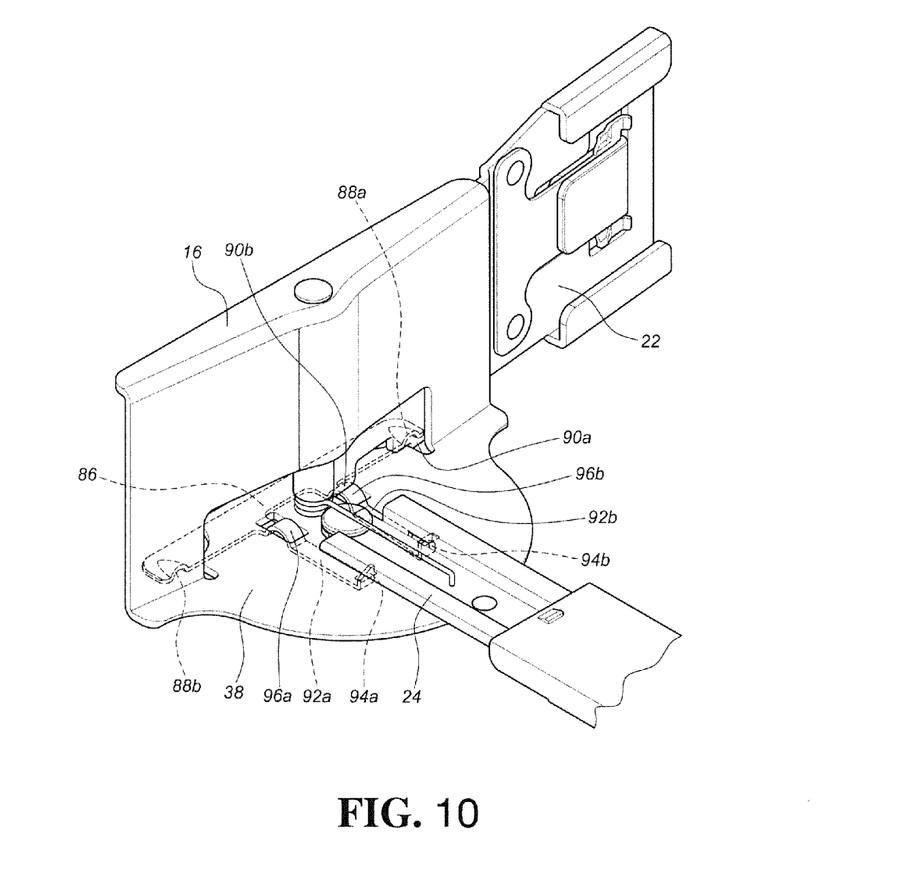
FIG. 10 shows that the second type of the stop member contacts the first support member.

FIG. 10 shows the second type of the stop member 86 of the present invention. The stop member 86 has two first stops 88a, 88b, two extension arms 92a, 92b, and two second stops 94a, 94b which are respectively and correspondingly connected to the two extension arms 92a, 92b. One of the two first stops 88a, 88b (such as the first stop 88a in FIG. 10) contacts the first protrusion 90a of the third connection element 22. One of the second stops 94a, 94b (such as the second stop 94a in FIG. 10) contacts the first support member 24. Each of the two extension arms 92a, 92b of the stop member 86 has a triggering portion 96a/96b. The third connection element 22 has a second protrusion 90b which is located corresponding to the triggering portion 96b of one of the two extension arms 92a, 92b (such as the extension arm 92b in FIG. 10). The second protrusion 90b contacts the triggering portion 96b to move the second stop 94b away from the first support member 24. By this arrangement, the first support member 24 can only swing toward the third connection element 22.

Figure 11:
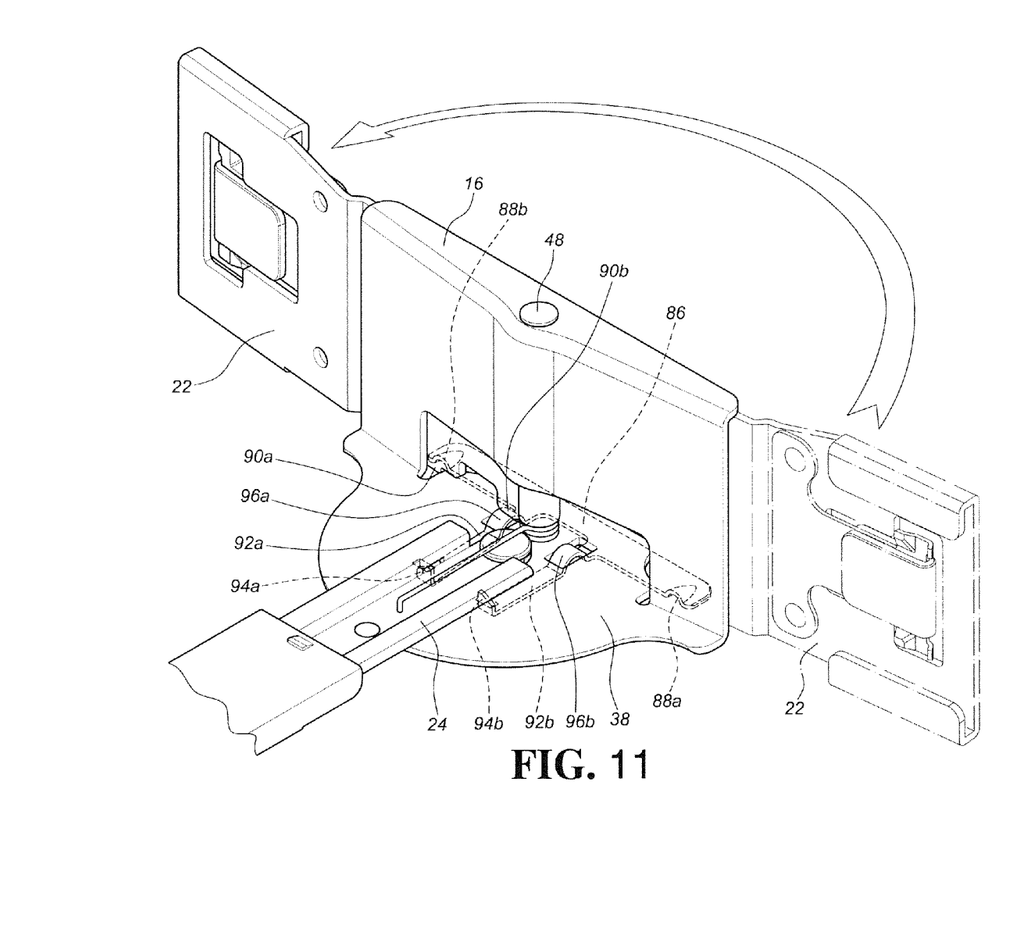
FIG. 11 shows that the third connection element contacts the second type of the stop member in different directions.

In FIG. 10, the first stops 88a, 88b, the extension arms 92a, 92b and the second stops 94a, 94b of the stop member 86 are in pair and symmetrically arrangement, so that the third connection element 22 can be installed on the right side or the left side relative to the support seat 16. As shown in FIG. 11, when the third connection element 22 is pivoted about the first pivoting member 48 and change the position from the side (as illustrated by the dotted lines) of the support seat 16 to the other side (as illustrated by the solid lines) of the support seat 16, the first stop 88a of the stop member 86 can be pressed and disengaged from the first protrusion 90a of the third connection element 22, so that the third connection element 22 is turnable. After the third connection element 22 turns, the other stop 88b of the stop member 86 contacts the first protrusion 90a of the third connection element 22 to secure the relative position between the support seat 16 and the third connection element 22. Wherein, the second protrusion 90b of the third connection element 22 presses the triggering portion 96a of the other extension arm 92a to remove the second stop 94a from the first support member 24. By this way, the first support member 24 swings toward the third connection element 22, and the first support member 24 is stopped by the second stop 94b of the stop member 86 and cannot swing toward the opposite direction of the third connection element 22.

Figure 12:
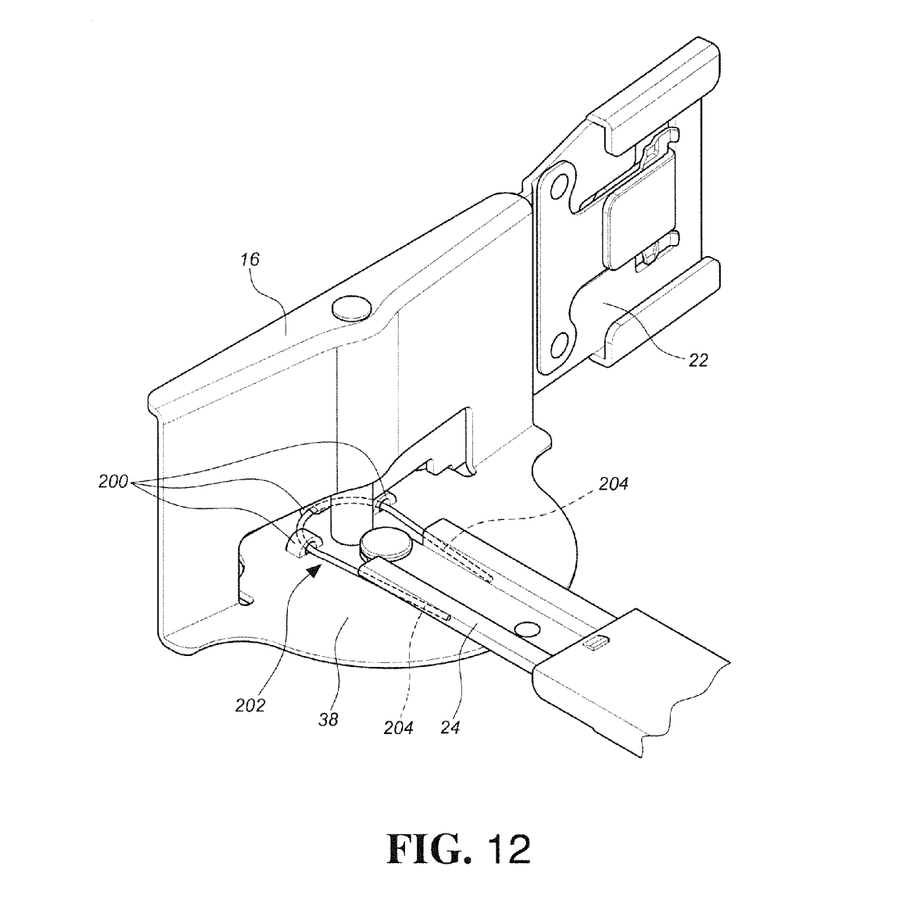
FIG. 12 shows that another type of the second resilient member contacts the first support member.

FIG. 12 shows another type of the second resilient member 202 of the present invention, wherein the support seat 16 has a fixing portion 200 so that the second resilient member 202 can be fixed to the support seat 16. The second resilient member 202 has two second resilient legs 204 which contact the two sides of the first support member 24 respectively, so that the first support member 24 can be pivoted within a pre-set angular range relative to the support seat 16 by the force of the second resilient member 202.

Figure 13:
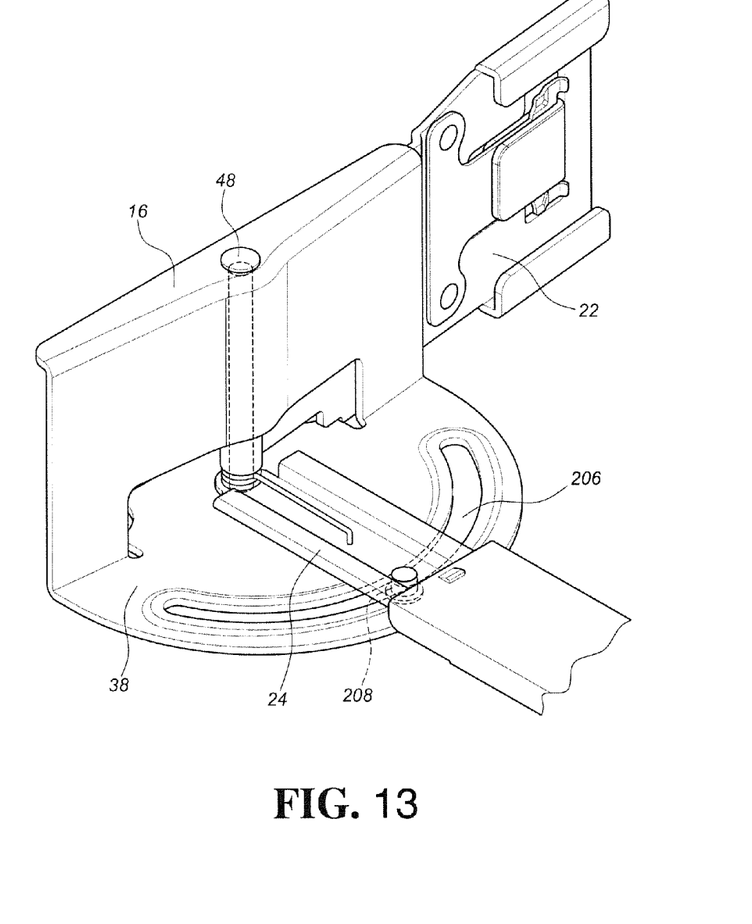
FIG. 13 shows another connecting relation among the support seat, the first support member and the third connection element.

FIG. 13 shows another connecting relation among the support seat 16, the first support member 24 and the third connection element 22 of the present invention. The support seat 16 has a curved slot 206 whose center is located at the axis of the first pivoting member 48. The first support member 24 is movably located in the curved slot 206 by a pin 208. When the first support member 24 swings relative to the support seat 16, the pin 208 moves along the curved slot 206. Wherein, the first support member 24, the support seat 16 and the third connection element 22 are pivotably connected to each other by the first pivoting member 48.

As the foregoing embodiments of the present invention shown, the cable management arm provides a firm support when the cable management arm is in the retracted status (as shown in FIG. 4). When the cable management arm is in the extended status (as shown in FIGS. 5-8), the weight of the cable management arm is well supported, so that the cable management arm does not overly bend downward due to gravity.

While we have shown and described the embodiment in accordance with the present invention, it should be clear to those skilled in the art that further embodiments may be made without departing from the scope of the present invention.

What is claimed is:

1. A cable management arm comprising:
  a first arm;
  a second arm;
  a frame pivotably connected between the first and second arms;
  an extension board fixed to the bottom of the frame;

a support seat having a support board;
a first connection element connected to the first arm;
a second connection element connected to the second arm;
a third connection element connected to the support seat;
a first support member pivotably connected to the support seat and contacting the support board of the support seat;
a second support member slidably connected to the first support member and retractable relative to the first support member;
a first resilient member connected between the first and second support members so that the second support member is pulled relative to the first support member by the first resilient member;
a slide pivotably connected to the bottom of the frame and contacting the extension board, the slide slidably connected to the second support member, and
the first arm being located at a fixed first position by the first connection element, the second arm being located at a movable second position by the second connection element, the support seat being located at a fixed third position by the third connection element, when the second connection element of the second arm is moved away from the first connection element of the first arm, the frame is moved away from the support seat by sliding movement of the slide along the second support member, the slide moves the second support member to extend relative to the first support member, and the first support member swings relative to the support seat.

2. The cable management arm as claimed in claim 1, wherein the second support member has a first block which is located corresponding to the slide, the slide contacts the first block and drives the second support member to move relative to the first support member.

3. The cable management arm as claimed in claim 2, wherein the second support member has a second block which is located corresponding to the slide, the slide slides between the first block and the second block.

4. The cable management arm as claimed in claim 1, wherein the first support member has a first hook and the second support member has a second hook, the first resilient member is connected between the first and second hooks.

5. The cable management arm as claimed in claim 1, wherein the support seat is pivotably connected to the third connection element by a first pivoting member, the first support member is pivotably connected to the support seat by a second pivoting member.

6. The cable management arm as claimed in claim 5, further comprising a second resilient member connected between the first support member and the support seat, the first support member returns within a pre-set angular range relative to the support seat by the second resilient member.

7. The cable management arm as claimed in claim 6, wherein the second resilient member has a scrolling portion which is mounted to the first pivoting member and the scrolling portion has a first resilient leg extending therefrom which contacts the first support member.

8. The cable management arm as claimed in claim 5, wherein the support board of the support seat is horizontal and has a round periphery whose center is located at an axis of the second pivoting member, a pin is connected to the first support member which is movable along the round periphery of the support seat by the pin.

9. The cable management arm as claimed in claim 1, wherein the support seat, the third connection element and the first support member are pivotably connected to each other by the first pivoting member.

10. The cable management arm as claimed in claim 9, further comprising a second resilient member connected between the support seat and the first support member, so that the first support member returns within a pre-set angular range relative to the support seat by the second resilient member.

11. The cable management arm as claimed in claim 10, wherein the support seat has a fixing portion to fix the second resilient member, the second resilient member has two second resilient legs which contact the two sides of the first support member respectively.

12. The cable management arm as claimed in claim 9, wherein the support seat has a curved slot whose center is located at an axis of the first pivoting member, the first support member is movably located in the curved slot by a pin.

13. The cable management arm as claimed in claim 1, wherein the extension board has a rib extending downward therefrom and the rib contacts the slide.

14. The cable management arm as claimed in claim 13, wherein the thickness of the rib is gradually increased from a center near an edge of the bottom of the extension board to two sides of the extension board.

15. The cable management arm as claimed in claim 1, wherein a stop member is connected to the support seat and has at least one first stop, the third connection element has a first protrusion located corresponding to the at least one first stop, the support seat contacts the first protrusion of the third connection element by the at least one first stop of the stop member.

16. The cable management arm as claimed in claim 15, wherein the stop member has an extension arm and a second stop which is connected to the extension arm, the second stop is located to contact one side of the first support member.

17. The cable management arm as claimed in claim 15, wherein the stop member has two first stops, two extension arms, and two second stops which are connected to the two extension arms, one of the two first stops contacts the first protrusion of the third connection element, one of the second stops contacts the first support member.

18. The cable management arm as claimed in claim 17, wherein each of the two extension aims of the stop member has a triggering portion, the third connection element has a second protrusion which is located corresponding to the triggering portion of one of the two extension arms, the second protrusion contacts the triggering portion to move the second stops away from the first support member.

19. The cable management arm as claimed in claim 1 further comprising a first slide assembly and a second slide assembly, the first slide assembly having a first fixed rail and a first movable rail which is longitudinally movable relative to the first fixed rail, the second slide assembly having a second fixed rail and a second movable rail which is longitudinally movable relative to the second fixed rail, the first connection element connected to the first fixed rail and secured at the first position, the second connection element connected to the first movable rail and located at the second position which is variable when the first movable rail is moved relative to the first fixed rail, the third connection element connected to the second fixed rail of the second slide assembly and secured at the third position.

20. A cable management arm comprising:
a first slide assembly having a first fixed rail and a first movable rail which is longitudinally movable relative to the first fixed rail;
a second slide assembly having a second fixed rail and a second movable rail which is longitudinally movable relative to the second fixed rail;

a first arm connected to the first fixed rail of the first slide assembly;

a second arm connected to the first movable rail of the first slide assembly;

a frame pivotably connected between the first and second arms;

a support seat connected to the second fixed rail of the second slide assembly;

a first support member pivotably connected to the support seat and contacting the support seat;

a second support member slidably connected to the first support member;

a first resilient member connected between the first and second support members;

a slide pivotably connected to the frame and slidably connected to the second support member;

when the first and second slide assemblies are pulled, the second arm moves away from the first arm, the slide slides along the second support member and away from the support seat, the slide drives the second support member to extend relative to the first support member, so that the first support member swings relative to the support seat, and when the first and second slide assemblies are retracted, the second arm moves toward the first arm, the second support member moves in response to the first resilient member and relative to the first support member.

* * * * *